United States Patent
Mukaiyama et al.

(10) Patent No.: US 6,901,100 B2
(45) Date of Patent: May 31, 2005

(54) SEMICONDUCTOR LASER DEVICE IN WHICH NEAR-EDGE PORTION OF UPPER CLADDING LAYER IS INSULATED FOR PREVENTING CURRENT INJECTION

(75) Inventors: Akihiro Mukaiyama, Kaisei-machi (JP); Toshiaki Fukunaga, Kaisei-machi (JP); Toshiaki Kuniyasu, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 53 days.

(21) Appl. No.: 10/187,798

(22) Filed: Jul. 3, 2002

(65) Prior Publication Data

US 2003/0007532 A1 Jan. 9, 2003

(51) Int. Cl.[7] ................................................ H01S 5/00
(52) U.S. Cl. .......................................... 372/46; 372/43
(58) Field of Search ....................................... 372/39–50

(56) References Cited

U.S. PATENT DOCUMENTS

| | | | | |
|---|---|---|---|---|
| 5,541,950 A | * | 7/1996 | Kizuki et al. ................. | 372/46 |
| 5,563,902 A | * | 10/1996 | Xu et al. ....................... | 372/50 |
| 5,636,234 A | * | 6/1997 | Takagi .......................... | 372/43 |
| 5,661,743 A | * | 8/1997 | Nagai ........................... | 372/46 |
| 5,675,601 A | * | 10/1997 | Karakida et al. .............. | 372/46 |
| 5,751,754 A | * | 5/1998 | Takagi .......................... | 372/46 |
| 6,563,852 B1 | * | 5/2003 | Baillargeon et al. ........... | 372/45 |

* cited by examiner

*Primary Examiner*—Don Wong
*Assistant Examiner*—Phillip Nguyen
(74) *Attorney, Agent, or Firm*—Sughrue Mion, PLLC

(57) ABSTRACT

In a semiconductor laser device: a p-type $Al_zGa_{1-z}As$ cladding layer is formed above an active layer, where $z \geq 0.3$; a p-type GaAs contact layer is formed on the cladding layer except for at least one near-edge portion of the cladding layer; and an electrode is formed on at least the contact layer. The upper surface of each of the at least one near-edge portion of the cladding layer is insulated, where each of the at least one near-edge portion of the cladding layer is located in a vicinity of one of opposite end facets perpendicular to the direction of laser emission.

19 Claims, 5 Drawing Sheets

SEMICONDUCTOR LASER DEVICE IN WHICH NEAR-EDGE PORTION OF UPPER CLADDING LAYER IS INSULATED FOR PREVENTING CURRENT INJECTION

BACKGROUND OF THE INVENTION

1. Field of the Invention

The present invention relates to a semiconductor laser device in which a waveguide in a resonator has current noninjection regions in vicinities of end facets. The present invention also relates to a process for producing such a semiconductor laser device.

2. Description of the Related Art

Currently, semiconductor laser devices are widely used as light sources for optical information equipment. In particular, high output power and reliability are required in semiconductor laser devices which are used in write-once and erasable optical disk drives and the like.

One of the factors which decreases the reliability of the semiconductor laser devices is degradation or damage of laser-light-emission end facets caused by heat generation. In order to solve this problem, the Japanese Unexamined Patent Publication No. 2(1990)-239679 discloses a method for realizing a current noninjection region in a vicinity of a laser-light-emission end facet of a semiconductor laser device and suppressing Joule heat generation in the vicinity of the laser-light-emission end facet. However, according to the disclosed method, a current blocking layer of made GaAs as a direct transition semiconductor material is formed in the vicinity of the laser-light-emission end facet of the semiconductor laser device. Therefore, light absorption occurs in the current blocking layer, and thus it is impossible to achieve a satisfactory current-optical output characteristic.

The registered Japanese Patents Nos. 2833962 and 2879875 disclose methods for easily realizing current noninjection in a vicinity of a laser-light-emission end facet and achieving a satisfactory current-optical output characteristic. In these methods, in order to realize a current noninjection region in the vicinity of the laser-light-emission end facet, and prevent degradation of the vicinity of the laser-light-emission end facet in which heat generation is likely to occur, a portion of a p-type GaAs contact layer in the vicinity of the laser-light-emission end facet is removed by etching so that a steplike elevation change and an overhanging profile of a surface of an electrode base layer are produced in an electrode base layer or layers on which electrodes are formed, the steplike elevation change separates an electrode for current injection from an electrode formed in the vicinity of the laser-light-emission end facet, and current in the vicinity of the laser-light-emission end facet is substantially stopped by the separation of the electrodes.

Incidentally, the cooling efficiency in the junction-down mounting is high. Therefore, in order to operate semiconductor laser devices with high output power, it is effective to junction-down mount the semiconductor laser devices on a heatsink. However, when the semiconductor laser devices disclosed in the registered Japanese Patents Nos. 2833962 and 2879875 are junction-down mounted on a heatsink, i.e., the p electrode sides of the semiconductor laser devices are bonded to the heatsink, the separated electrodes in the disclosed semiconductor laser devices are connected by soldering material, and therefore the current noninjection region cannot be realized in the vicinity of the laser-light-emission end facet. Thus, it is impossible to operate the semiconductor laser devices with high output power.

In addition, in order to separate the p side electrodes with the steplike elevation change, the p-type GaAs contact layer is required to be overetched. Therefore, it is necessary to grow the p-type GaAs contact layer to a thickness of 1.0 to 3.0 micrometers, which is greater than the thickness of the normal GaAs contact layer, 0.2 micrometers. That is, additional amounts of time, material, and energy are spent for growing such a thick contact layer. Therefore, the methods disclosed in the registered Japanese Patents Nos. 2833962 and 2879875 are not preferable from the viewpoints of productivity, energy consumption, and influence on the environment.

Further, when the p-type GaAs contact layer, which is thicker than the normal GaAs contact layer, is wet etched for removing the near-edge portions of the p-type GaAs contact layer in the vicinity of the laser-light-emission end facet, and an etching solution of $NH_4OH$ or $KOH$ and a resist mask which is conventionally used in production of semiconductor laser devices are used for the wet etching, the resist is heavily damaged. For example, the resist deteriorates and becomes unremovable, or interpenetration between the resist and the GaAs contact layer occurs. Therefore, it is impossible to perform normal etching.

SUMMARY OF THE INVENTION

An object of the present invention is to provide a highly reliable, high-output-power semiconductor laser device having a current noninjection region which prevents degradation or damage in a vicinity of an end facet perpendicular to the direction of laser emission, and is formed without thickening a p-type GaAs contact layer or making a separation of electrodes with a great elevation change of a surface of an electrode base layer.

Another object of the present invention is to provide a process for producing a highly reliable, high-output-power semiconductor laser device, which can easily form a current noninjection region for prevention of degradation or damage in a vicinity of an end facet perpendicular to the direction of laser emission without thickening a p-type GaAs contact layer or making a separation of electrodes with a great elevation change of a surface of an electrode base layer.

(1) According to the first aspect of the present invention, there is provided a semiconductor laser device comprising: an active layer; a cladding layer made of p-type $Al_zGa_{1-z}As$ and formed above the active layer, where $z \geq 0.3$; a contact layer made of p-type GaAs and formed on the cladding layer except for at least one near-edge portion of the cladding layer; and an electrode formed on at least the contact layer. In the semiconductor laser device, an upper surface of each of the at least one near-edge portion of the cladding layer is insulated, and each of the at least one near-edge portion of the cladding layer is located in a vicinity of one of opposite end facets perpendicular to the direction of laser emission.

The cladding layer and the contact layer are formed on semiconductor layers which include the active layer. The semiconductor layers are formed so as to realize desired functions of the semiconductor laser device other than the function which is characteristic to the present invention and realized by the structure of the cladding layer and the contact layer. For example, the semiconductor layers may be formed on a n-type GaAs substrate. In addition, the semiconductor layers may include a lower cladding layer, a lower optical waveguide layer, the active layer, and an upper optical waveguide layer formed in this order.

Preferably, the semiconductor laser device according to the first aspect of the present invention may also have one or any possible combination of the following additional features (i) to (iv).

(i) The upper surface may be insulated by oxidation.
(ii) The electrode may be formed on the upper surface as well as the contact layer.
(iii) The semiconductor laser device according to the first aspect of the present invention may further comprise a stripe structure realizing a current injection region and having a predetermined width, wherein each of the at least one near-edge portion of the cladding layer extends over at least the predetermined width of the stripe structure in the vicinity of one of the opposite end facets. The near-edge portion of the cladding layer may extend to the full width of the end facet.
(iv) It is preferable that the aluminum composition z of the p-type $Al_zGa_{1-z}As$ cladding layer is between 0.48 and 0.85. For example, the cladding layer may be made of p-type $Al_{0.48}Ga_{0.52}As$.

(2) According to the second aspect of the present invention, there is provided a process for producing a semiconductor laser device, comprising the steps of: (a) forming a semiconductor layers including an active layer; (b) forming over the semiconductor layers a cladding layer made of p-type $Al_zGa_{1-z}As$, where $z \geq 0.3$; (c) forming on the cladding layer a contact layer made of p-type GaAs; (d) removing at least one near-edge portion of the contact layer so as to expose at least one near-edge portion of the cladding layer, insulating the at least one near-edge portion of the cladding layer, and forming an electrode on at least the contact layer, where each of the at least one near-edge portion of the contact layer and the at least one near-edge portion of the cladding layer is located in a vicinity of one of opposite end facets perpendicular to the direction of laser emission.

In the step (d), the removal of the at least one near-edge portion of the contact layer and the insulation of the at least one near-edge portion of the cladding layer may be performed either concurrently or separately. For example, when the at least one near-edge portion of the contact layer is etched off with a solution containing oxygen, which oxidizes aluminum in the cladding layer made of p-type $Al_zGa_{1-z}As$, the removal of the at least one near-edge portion of the contact layer and the insulation of the at least one near-edge portion of the cladding layer are performed concurrently.

In addition, the formation of the electrode may precede the removal of the at least one near-edge portion of the contact layer and the insulation of the at least one near-edge portion of the cladding layer.

Preferably, the process according to the second aspect of the present invention may also have one or any possible combination of the aforementioned additional features (i) to (iv).

(3) According to the third aspect of the present invention, there is provided a semiconductor laser device comprising: a substrate made of n-type GaAs; a buffer layer made of n-type GaAs and formed above the substrate; a lower cladding layer made of n-type $In_{0.5}Ga_{0.5}P$ and formed above the buffer layer; a lower optical waveguide layer made of n-type or i-type $In_{x1}Ga_{1-x1}As_{1-y1}P_{y1}$ and formed above the lower cladding layer, where $0 \leq x1 \leq 0.3$, $x1=0.5y1$; a quantum-well active layer made of $In_{x3}Ga_{1-x3}As_{1-y3}P_{y3}$ and formed above the lower optical waveguide layer, where $0 \leq x3 \leq 0.4$, $0 \leq y3 \leq 0.1$; an upper optical waveguide layer made of p-type or i-type $In_{x1}Ga_{1-x1}As_{1-y1}P_{y1}$ and formed above the quantum-well active layer; a first upper cladding layer made of p-type $In_{0.5}Ga_{0.5}P$ and formed above the upper optical waveguide layer; an etching stop layer made of GaAs and formed above the first upper cladding layer except for a stripe portion of the first upper cladding layer so as to form a first portion of a stripe groove in which a current injection region is realized; a current confinement layer made of n-type $In_{0.5}(Ga_{1-x4}Al_{x4})_{0.5}P$ and formed above the etching stop layer so as to form a second portion of the stripe groove, where $0 \leq x4 \leq 1$; a second upper cladding layer made of p-type $Al_zGa_{1-z}As$ and formed over the current confinement layer so as to fill the stripe groove, where $0.48 \leq z \leq 0.85$; a contact layer made of p-type GaAs and formed on the second upper cladding layer except for at least one near-edge portion of the second upper cladding layer; and an electrode formed on at least the contact layer. In the semiconductor laser device, an upper surface of each of the at least one near-edge portion of the second upper cladding layer is insulated, and each of the at least one near-edge portion of the second upper cladding layer is located in a vicinity of one of opposite end facets perpendicular to the direction of laser emission.

Preferably, the semiconductor laser device according to the third aspect of the present invention may also have one or any possible combination of the aforementioned additional features (i) and (ii) and the following additional features (v) and (vi).

(v) It is preferable that the aluminum composition z of the p-type $Al_zGa_{1-z}As$ second upper cladding layer is between 0.48 and 0.85. For example, the second upper cladding layer may be made of p-type $Al_{0.48}Ga_{0.52}As$.
(vi) In the semiconductor laser device according to the third aspect of the present invention, wherein the stripe groove has a predetermined width, and each near-edge portion of the second upper cladding layer extends over at least the predetermined width of said stripe groove in the vicinity of one of the opposite end facets.

(4) According to the fourth aspect of the present invention, there is provided a process for producing a semiconductor laser device, comprising the steps of: (a) forming a buffer layer made of n-type GaAs, a lower cladding layer made of n-type $In_{0.5}Ga_{0.5}P$, a lower optical waveguide layer made of n-type or i-type $In_{x1}Ga_{1-x1}As_{1-y1}P_{y1}$, a quantum-well active layer made of $In_{x3}Ga_{1-x3}As_{1-y3}P_{y3}$, an upper optical waveguide layer made of p-type or i-type $In_{x1}Ga_{1-x1}As_{1-y1}P_{y1}$, a first upper cladding layer made of p-type $In_{0.5}Ga_{0.5}P$, an etching stop layer made of GaAs, a current confinement layer made of n-type $In_{0.5}(Ga_{1-x4}Al_{x4})_{0.5}P$, and a cap layer made of GaAs in this order above a substrate made of n-type GaAs, where $0 \leq x1 \leq 0.3$, $x1=0.5y1$, $0 \leq x3 \leq 0.4$, $0 \leq y3 \leq 0.1$, and $0 \leq x4 \leq 1$; (b) removing a first portion of the cap layer having a stripe form and corresponding to a current injection region so as to leave a second portion of the cap layer; (c) etching off a first portion of the current confinement layer having a stripe form by using the second portion of the cap layer as a mask so as to leave a second portion of the current confinement layer and form a first portion of a stripe groove for current injection; (d) removing the second portion of the cap layer and a first portion of the etching stop layer having a stripe form so as to leave a second portion of the etching stop layer and form a second portion of the stripe groove; (e) forming over the second portion of the current confinement layer a second upper cladding layer made of p-type $Al_zGa_{1-z}As$ so as to fill the stripe groove, where $0.48 \leq z \leq 0.85$; (f) forming on the second upper cladding layer a contact layer made of p-type GaAs; (g) removing at least one near-edge portion of the contact layer so as to expose at least one near-edge portion of the second upper cladding layer, insulating the at least one near-edge portion of the second upper cladding layer, and forming an electrode on at least the contact layer, where each of the at least one near-edge portion of the contact layer and the at least one near-edge portion of the second upper cladding layer is located in a vicinity of one of opposite end facets perpendicular to the direction of laser emission.

Preferably, the process according to the fourth aspect of the present invention may also have one or any possible combination of the aforementioned additional features (i), (ii), (v), and (vi).

(5) The advantages of the present invention are as follows.

(i) In the conventional semiconductor laser devices, local heat generation is likely to occur in the vicinity of the opposite end facets perpendicular to the direction of laser emission. However, according to the present invention, a current noninjection region can be realized in the vicinity of each of at least one of the opposite end facets, and therefore degradation or damage in the vicinity of each of at least one of the opposite end facets can be surely prevented.

(ii) Since the cladding layer in the semiconductor laser device according to the first aspect of the present invention or the second upper cladding layer in the semiconductor laser device according to the second aspect of the present invention is made of an AlGaAs material having high aluminum composition, the at least one near-edge portion of the cladding layer or the second upper cladding layer which is located under the at least one near-edge portion of the contact layer can be easily oxidized so that an oxide film having an insulation property is formed on the surface of each of the at least one near-edge portion of the cladding layer or the second upper cladding layer. Since the surface of each of the at least one near-edge portion of the cladding layer or the second upper cladding layer is insulated, current does not flow in the vicinity of the end facet under the insulated surface of each of the at least one near-edge portion of the cladding layer or the second upper cladding layer even when a portion of the electrode exists on the insulated surface of the near-edge portion of the cladding layer or the second upper cladding layer. That is, a current noninjection region is realized in the vicinity of the end facet under the insulated surface of each near-edge portion of the cladding layer or the second upper cladding layer. Therefore, local heat generation does not occur in the vicinity of the end facet under the insulated surface of each near-edge portion of the cladding layer or the second upper cladding layer, and degradation or damage in the vicinity of the end facet can be surely prevented.

(iii) Since the current noninjection region is realized in the vicinity of each of at least one of the opposite end facets, degradation or damage in the vicinity of the end facet can be surely prevented without changing the structure in the vicinity of the active layer or the current confinement structure, although the characteristics of the semiconductor laser device are affected by the change in the structure in the vicinity of the active layer or the current confinement structure.

(iv) In the semiconductor laser device according to the present invention, the current noninjection region can be realized in the vicinity of the laser-light-emission end facet without separation of electrodes by forming a great steplike elevation change or an overhanging profile of the surface of the electrode base layer. Therefore, the semiconductor laser devices according to the present invention can be junction-down mounted on a heatsink, where the junction-down mounting is most preferable for increasing output power. Thus, it is possible to realize a reliable semiconductor laser device which can operate with high output power.

In addition, since the contact layer is not required to be thickened, the contact layer can be normally etched, and the productivity can be increased.

(v) In the case where the removal of the at least one near-edge portion of the contact layer (or the second upper cladding layer) and the insulation of the at least one near-edge portion of the cladding layer (or the second upper cladding layer) are performed concurrently, an oxide film having an insulation property is automatically formed on the surface of each of the at least one near-edge portion of the cladding layer (or the second upper cladding layer) when the near-edge portion of the contact layer is removed. Therefore, the production process can be simplified, and the semiconductor laser device according to the first or second aspect of the present invention can be easily produced.

DESCRIPTION OF PREFERRED EMBODIMENTS

Embodiments of the present invention are explained in detail below with reference to drawings.

Construction of First Embodiment

Figure 1:
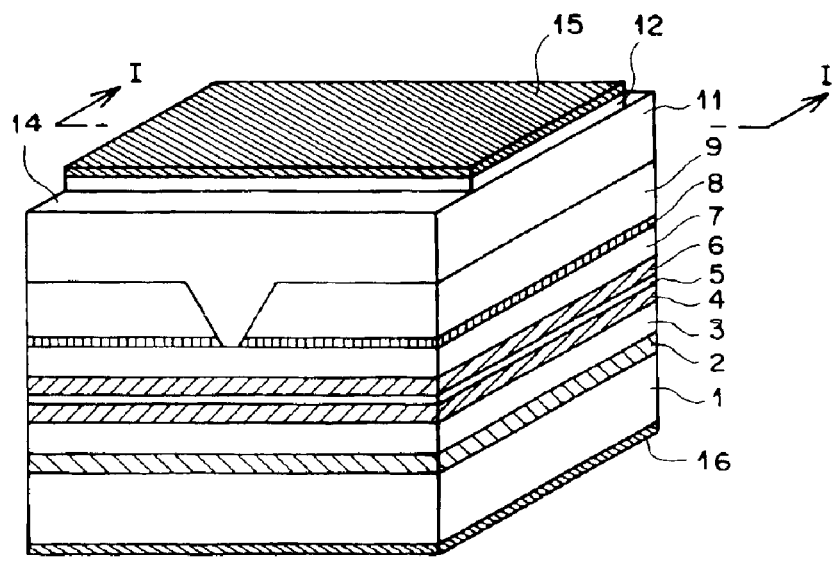
FIG. 1 is a perspective view of a semiconductor laser device as a first embodiment of the present invention.

FIG. 1 is a perspective view of a semiconductor laser device as the first embodiment of the present invention. As illustrated in FIG. 1, the semiconductor laser device as the first embodiment of the present invention includes an n-type GaAs buffer layer 2, an n-type $In_{0.5}Ga_{0.5}P$ lower cladding layer 3, an n-type or i-type $In_{x1}Ga_{1-x1}As_{1-y1}P_{y1}$ lower optical waveguide layer 4 ($0 \leq x1 \leq 0.3$, $x1=0.5y1$), an $In_{x3}Ga_{1-x3}As_{1-y3}P_{y3}$ quantum-well active layer 5 ($0 \leq x3 \leq 0.4$, $0 \leq y3 \leq 0.1$), a p-type or i-type $In_{x1}Ga_{1-x1}As_{1-y1}P_{y1}$ upper optical waveguide layer 6, a p-type $In_{0.5}Ga_{0.5}P$ first upper cladding layer 7, a GaAs etching stop layer 8, an n-type $In_{0.5}(Ga_{1-x4}Al_{x4})_{0.5}P$ current confinement layer 9 ($0 \leq x4 \leq 1$), a p-type $Al_zGa_{1-z}As$ second upper cladding layer 11 ($0.48 \leq z \leq 0.85$), and a p-type GaAs contact layer 12 are formed in this order on an n-type GaAs substrate 1. A stripe groove realizing a current injection region is formed through the thickness of the GaAs etching stop layer 8 and the n-type $In_{0.5}(Ga_{1-x4}Al_{x4})_{0.5}P$ current confinement layer 9, and the p-type $Al_zGa_{1-z}As$ second upper cladding layer 11 is formed so as to fill the stripe groove.

In addition, predetermined portions of the p-type GaAs contact layer 12 corresponding to current injection regions are removed, and the upper surfaces of the portions of the p-type $Al_zGa_{1-z}As$ second upper cladding layer 11 under the removed portions of the p-type GaAs contact layer 12 are insulated by oxidation. A p electrode 15 is formed on the remaining portion of the p-type GaAs contact layer 12, and an n electrode 16 is formed on the back surface of the n-type GaAs substrate 1. Although the p electrode 15 is formed on only the remaining portion of the p-type GaAs contact layer 12 in the construction illustrated in FIG. 1, in practice, the p electrode 15 covers the remaining portion of the p-type GaAs contact layer 12 and may also be formed on the insulated portions of the p-type $Al_zGa_{1-z}As$ second upper cladding layer 11. Even when the p electrode 15 exists on the insulated portions of the p-type $Al_zGa_{1-z}As$ second upper cladding layer 11, the current cannot be injected through the insulated portions of the p-type $Al_zGa_{1-z}As$ second upper cladding layer 11, and therefore the current noninjection regions can be formed under the insulated portions of the p-type $Al_zGa_{1-z}As$ second upper cladding layer 11.

For insulation, it is preferable that the aluminum composition z of the p-type $Al_zGa_{1-z}As$ second upper cladding layer 11 is between 0.48 and 0.85. In particular, when the aluminum composition z of the p-type $Al_zGa_{1-z}As$ second upper cladding layer 11 does not exceed 0.85, the crystallinity of the p-type $Al_zGa_{1-z}As$ second upper cladding layer 11 is improved and the electrical resistance is reduced, so that uniform current injection can be realized.

Production Process in First Embodiment

Figure 3:
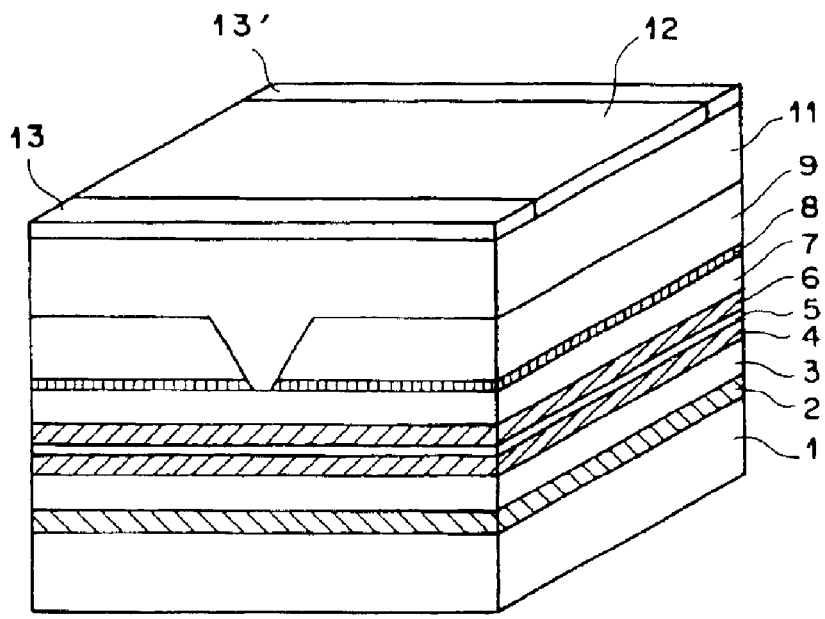
FIG. 3 is a perspective view of the layered structure in the fourth stage of the process for producing the semiconductor laser device as the first embodiment of the present invention.
Figure 4:
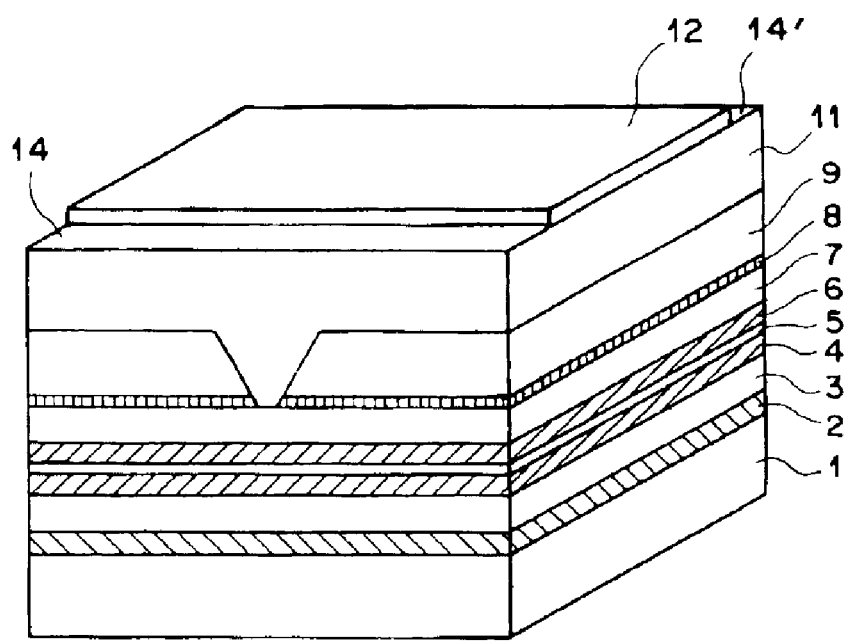
FIG. 4 is a perspective view of a layered structure in a fifth stage of the process for producing the semiconductor laser device as the first embodiment of the present invention.

A process for producing the semiconductor laser device as the first embodiment is explained below with reference to FIGS. 2A to 2D, 3, and 4. FIGS. 2A to 2D are cross-sectional views of layered structures in the first to fourth stages of the process which are taken at cross sections corresponding to the line I—I indicated in FIG. 1, FIG. 3 is a perspective view of the layered structure in the fourth stage of the process for producing the semiconductor laser device as the first embodiment of the present invention, and FIG. 4 is a perspective view of a layered structure in the fifth stage of the process, in which the aforementioned portions of the p-type $Al_zGa_{1-z}As$ second upper cladding layer 11 are insulated.

Figure 2A:
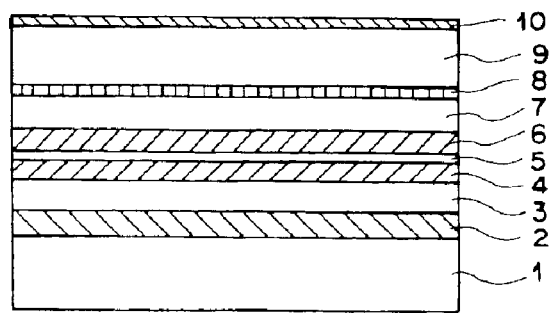
FIG. 2A is a cross-sectional view of a first stage of a process for producing a semiconductor laser device as the first embodiment of the present invention.

In the first stage, the n-type GaAs buffer layer 2, the n-type $In_{0.5}Ga_{0.5}P$ lower cladding layer 3, the n-type or i-type $In_{x1}Ga_{1-x1}As_{1-y1}P_{y1}$ lower optical waveguide layer 4 ($0 \leq x1 \leq 0.3$, $x1=0.5y1$), the $In_{x3}Ga_{1-x3}As_{1-y3}P_{y3}$ quantum-well active layer 5 ($0 \leq x3 \leq 0.4$, $0 \leq y3 \leq 0.1$), the p-type or i-type $In_{x1}Ga_{1-x1}As_{1-y1}P_{y1}$ upper optical waveguide layer 6, the p-type $In_{0.5}Ga_{0.5}P$ first upper cladding layer 7, the GaAs etching stop layer 8, the n-type $In_{0.5}(Ga_{1-x4}Al_{x4})_{0.5}P$ current confinement layer 9 ($0 \leq x4 \leq 1$), and a GaAs cap layer 10 are formed in this order on the GaAs substrate 1, as illustrated in FIG. 2A.

Figure 2B:
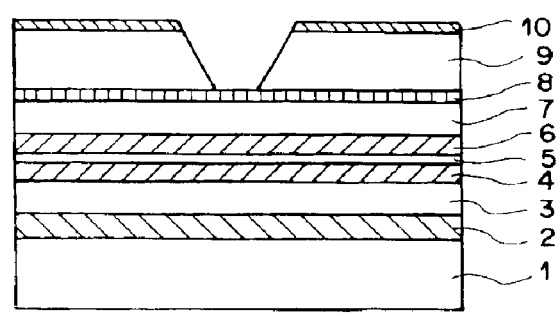
FIG. 2B is a cross-sectional view of a second stage of the process for producing the semiconductor laser device as the first embodiment of the present invention.

In the second stage, a stripe portion of the GaAs cap layer 10 corresponding to the current injection region is removed, and a stripe portion of the n-type $In_{0.5}(Ga_{1-x4}Al_{x4})_{0.5}P$ current confinement layer 9 exposed by the removal of the stripe portion of the GaAs cap layer 10 is etched off by using the remaining portions of the GaAs cap layer 10 as a mask, until a stripe portion of the GaAs etching stop layer 8 is exposed as illustrated in FIG. 2B.

Figure 2C:
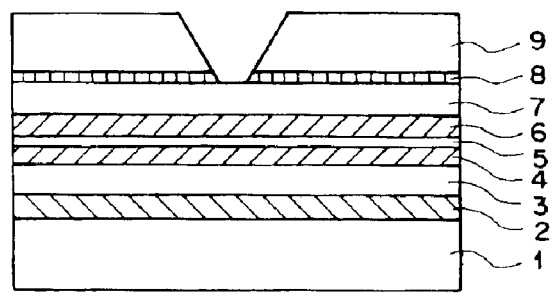
FIG. 2C is a cross-sectional view of a third stage of the process for producing the semiconductor laser device as the first embodiment of the present invention.

In the third stage, the remaining portions of the GaAs cap layer 10 and the exposed stripe portion of the GaAs etching stop layer 8 are concurrently etched off as illustrated in FIG. 2C.

Figure 2D:
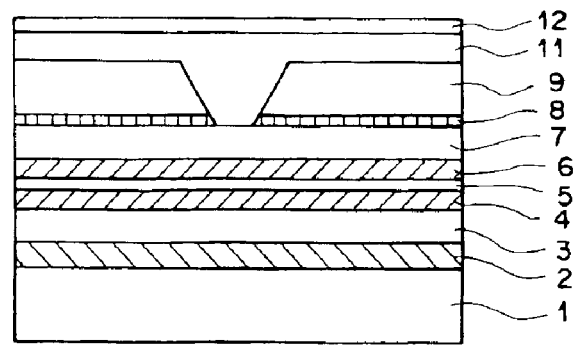
FIG. 2D is a cross-sectional view of a fourth stage of the process for producing the semiconductor laser device as the first embodiment of the present invention.

In the fourth stage, the p-type $Al_zGa_{1-z}As$ second upper cladding layer 11 ($0.48 \leq z \leq 0.85$) and the p-type GaAs contact layer 12 are formed on the layered structure of FIG. 2C, as illustrated in FIGS. 2D and 3.

Next, the portions 13 and 13' (illustrated in FIG. 3) of the p-type GaAs contact layer 12 corresponding to the current injection regions are removed, and the upper surfaces 14 and 14' of the portions of the p-type $Al_zGa_{1-z}As$ second upper cladding layer 11 under the removed portions 13 and 13' of the p-type GaAs contact layer 12 are insulated by oxidation, as illustrated in FIG. 4. Finally, the p electrode 15 is formed on the remaining portion of the p-type GaAs contact layer 12, and the n electrode 16 is formed on the back surface of the n-type GaAs substrate 1.

The removal of the portions 13 and 13' of the p-type GaAs contact layer 12 and the oxidation of the upper surfaces 14 and 14' of the above portions of the p-type $Al_zGa_{1-z}As$ second upper cladding layer 11 may be performed either concurrently or separately. However, from the viewpoints of simplification of the production process and increase in productivity, it is preferable to concurrently perform the removal of the regions 13 and 13' of the p-type GaAs contact layer 12 and the oxidation of the upper surfaces 14 and 14' of the portions of the p-type $Al_zGa_{1-z}As$ second upper cladding layer 11.

For example, the removal of the regions 13 and 13' of the p-type GaAs contact layer 12 and the oxidation of the upper surfaces 14 and 14' of the portions of the p-type $Al_zGa_{1-z}As$ second upper cladding layer 11 can be concurrently performed by etching the upper surfaces of the structure of FIG. 4 with an etching solution containing an oxidizing agent which contains oxygen as a constituent element. An example of such an oxidizing agent is hydrogen peroxide.

Alternatively, the removal of the regions 13 and 13' of the p-type GaAs contact layer 12 and the oxidation of the upper surfaces 14 and 14' of the portions of the p-type $Al_zGa_{1-z}As$ second upper cladding layer 11 can be separately performed as follows. That is, first, the regions 13 and 13' of the p-type GaAs contact layer 12 are etched off by using an etching solution of $NH_4OH$ or KOH. Thereafter, the surfaces 14 and 14' of the portions of the p-type $Al_zGa_{1-z}As$ second upper cladding layer 11 exposed by the removal of the regions 13 and 13' of the p-type GaAs contact layer 12 are selectively oxidized for insulation by processing the exposed surfaces 14 and 14' with an aqueous solution into which ozone or oxygen is mixed by bubbling, or introducing oxygen gas during electrode sintering heat treatment.

In the above process, the p electrode 15 is formed after the removal of the regions 13 and 13' of the p-type GaAs contact layer 12 and the oxidation of the upper surfaces 14 and 14' of the portions of the p-type $Al_zGa_{1-z}As$ second upper cladding layer 11. Alternatively, the formation of the p electrode 15, the removal of the regions 13 and 13' of the p-type GaAs contact layer 12, and the oxidation of the upper surfaces 14 and 14' of the portions of the p-type $Al_zGa_{1-z}As$ second upper cladding layer 11 can be realized in accordance with the following procedure. That is, first, a patterned resist film is formed in the vicinities of the opposite end facets perpendicular to the direction of laser emission, and then a p electrode is formed over the layered structure. Next, the portions of the p electrode on the patterned resist film are selectively removed by the lift-off technique or the like. Thereafter, the portions of the contact layer which are exposed by the selective removal of the above portions of the p electrode are removed by using the remaining portion of the p electrode as a mask, and finally, the upper surfaces 14 and 14' of the portions of the p-type $Al_zGa_{1-z}As$ second upper cladding layer 11 are oxidized.

Second Embodiment

A current noninjection region can be realized in a vicinity of an end facet of the semiconductor laser devices according to the present invention when a surface of a portion of the p-type $Al_zGa_{1-z}As$ second upper cladding layer which extends over the width of the current injection in the vicinity of the end facet is insulated. Therefore, it is possible to remove additional portions of the p-type GaAs contact layer in vicinities of the lateral side edges (which are parallel to the direction of laser emission) of the semiconductor laser device as well as the aforementioned portions of the p-type GaAs contact layer in the vicinities of the opposite end facets perpendicular to the direction of laser emission, and insulate the surfaces of the portions of the p-type $Al_zGa_{1-z}As$ second upper cladding layer under the removed portions of the p-type GaAs contact layer.

Figure 5:
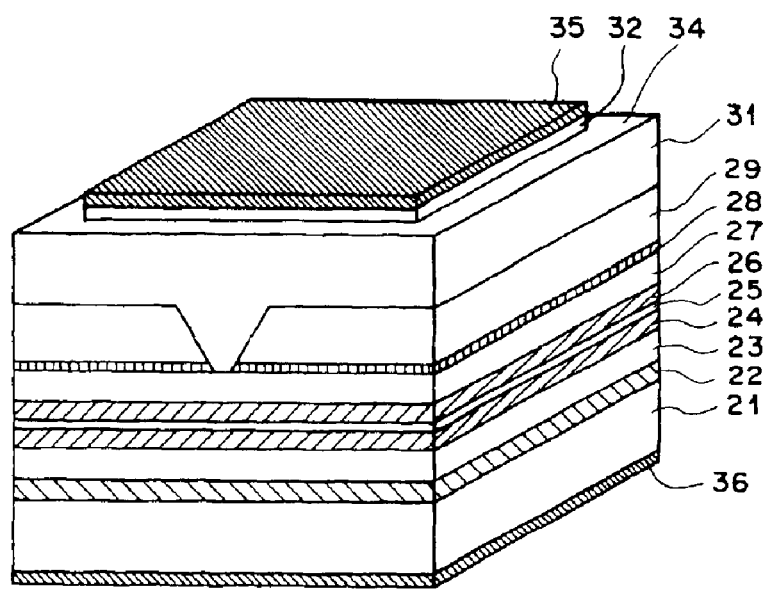
FIG. 5 is a perspective view of a semiconductor laser device as a second embodiment of the present invention.

FIG. 5 is a perspective view of a semiconductor laser device as the second embodiment of the present invention. As illustrated in FIG. 5, the semiconductor laser device as the second embodiment is different from the semiconductor laser device as the first embodiment in that additional portions of the p-type GaAs contact layer 32 in vicinities of the lateral side edges (which are parallel to the direction of laser emission) of the semiconductor laser device are removed as well as the aforementioned portions of the p-type GaAs contact layer 32 in the vicinities of the opposite end facets perpendicular to the direction of laser emission, and the surfaces 34 of the portions of the p-type $Al_zGa_{1-z}As$ second upper cladding layer 31 under the removed portions of the p-type GaAs contact layer 32 are insulated. In this case, the p electrode 35 may be or may not be left on the insulated surfaces 34 of the portions of the p-type $Al_zGa_{1-z}As$ second upper cladding layer 31 in the vicinities of the opposite end facets perpendicular to the direction of laser emission.

Advantages of Embodiments

As explained above, according to the present invention, the current noninjection regions can be realized in the vicinities of the opposite end facets perpendicular to the direction of laser emission, without separation of electrodes by forming a great steplike elevation change or an overhanging profile of the surface of the electrode base layer. Therefore, the semiconductor laser devices according to the present invention can be junction-down mounted on a heatsink, where the junction-down mounting is preferable for increasing output power. Thus, the semiconductor laser devices according to the present invention can operate with high output power and high reliability, and can be used as a light source in the fields of high-speed information and image processing, communications, laser measurement, medicine, printing, and the like. Further, the semiconductor laser devices according to the present invention can also be used as a light source in solid-state lasers such as SHG (second harmonic generation) apparatuses, optical integrated circuits, and the like.

Next, constructions and production processes of concrete examples of the semiconductor laser devices according to the present invention are explained below.

CONCRETE EXAMPLE I

A concrete example I of the semiconductor laser device as the first embodiment is produced as follows.

First, an n-type GaAs buffer layer 2, an n-type $In_{0.5}Ga_{0.5}P$ lower cladding layer 3, an n-type or i-type $In_{x1}Ga_{1-x1}As_{1-y1}P_{y1}$ lower optical waveguide layer 4 ($0 \leq x1 \leq 0.3$, $x1=0.5y1$), an $In_{x3}Ga_{1-x3}As_{1-y3}P_{y3}$ quantum-well active layer 5 ($0 \leq x3 \leq 0.4$, $0 \leq y3 \leq 0.1$), a p-type or i-type $In_{x1}Ga_{1-x1}As_{1-y1}P_{y1}$ upper optical waveguide layer 6, a p-type $In_{0.5}Ga_{0.5}P$ first upper cladding layer 7, a GaAs etching stop layer 8, an n-type $In_{0.5}Ga_{0.5}P$ current confinement layer 9, and a GaAs cap layer 10 are formed in this order on a (100) face of an n-type GaAs substrate 1 by organometallic vapor phase epitaxy, as illustrated in FIG. 2A.

Subsequently, a resist pattern which has a stripe opening having a width of 3 micrometers and extending in the normal (forward) mesa direction of the substrate 1 is formed by photolithography, and the GaAs cap layer 10 is etched by using the resist pattern as a mask and a mixture containing tartaric acid as an etchant. Then, the resist pattern is removed, and the n-type $In_{0.5}Ga_{0.5}P$ current confinement layer 9 is etched by using the remaining portions of the GaAs cap layer 10 as a mask and a solution of hydrochloric acid as an etchant. Thus, a stripe groove as illustrated in FIG. 2B is formed. Thereafter, the remaining portions of the GaAs cap layer 10 and the exposed portion of the GaAs etching stop layer 8 are concurrently etched off by using a mixture containing tartaric acid as an etchant, as illustrated in FIG. 2C.

Next, the p-type $Al_{0.48}Ga_{0.52}As$ second upper cladding layer 11 and the p-type GaAs contact layer 12 are formed on the layered structure of FIG. 2C by organometallic vapor phase epitaxy, as illustrated in FIGS. 2D and 3. Subsequently, a resist pattern film which has openings in areas corresponding to current noninjection regions are formed on the p-type GaAs contact layer 12 by photolithography, and the regions 13 and 13' of the p-type GaAs contact layer 12 which are not covered by the resist pattern film are selectively etched off by using a mixture containing ammonia and hydrogen peroxide as an etchant. At this time, the hydrogen peroxide contained in the etchant causes oxidation of the upper surfaces 14 and 14' of the portions of the p-type $Al_{0.48}Ga_{0.52}As$ second upper cladding layer 11, and an oxide film is automatically formed on the upper surfaces 14 and 14' of the portions of the p-type $Al_{0.48}Ga_{0.52}As$ second upper cladding layer 11, as illustrated in FIG. 4.

Thereafter, a Ti/Pt/Au electrode is formed as a p electrode 15 on the entire surface of the p-type GaAs contact layer 12 by EB (electron beam) evaporation, and RTA (rapidly thermal annealed) alloy processing is performed at 450° C. for one minute. Then, the n-type GaAs substrate 1 is polished to the thickness of 100 micrometers, an AuGe/Ni/Au electrode is formed as an n electrode 16 on the entire surface of the polished surface of the n-type GaAs substrate 1 by EB evaporation, and RTA alloy processing is performed at 350° C. for one minute. Thus, the layered structure as illustrated in FIG. 1 is formed.

In practice, a plurality of semiconductor laser devices each having the layered structure of FIG. 1 are concurrently produced on a wafer of the n-type GaAs substrate 1. Therefore, finally, the wafer on which the layered structure of FIG. 1 are formed for each semiconductor laser device are cleaved at the positions of the end facets of the plurality of semiconductor laser devices, and a high reflectance coating and a low reflectance coating are applied to the resonator surfaces produced by the cleavage.

CONCRETE EXAMPLE II

A concrete example II of the semiconductor laser device as the second embodiment is produced as follows.

First, an n-type GaAs buffer layer 22, an n-type $In_{0.5}Ga_{0.5}P$ lower cladding layer 23, an n-type or i-type $In_{x1}Ga_{1-x1}As_{1-y1}P_{y1}$ lower optical waveguide layer 24 ($0 \leq x1 \leq 0.3$, $x1 = 0.5y1$), an $In_{x3}Ga_{1-x3}As_{1-y3}P_{y3}$ quantum-well active layer 25 ($0 \leq x3 \leq 0.4$, $0 \leq y3 \leq 0.1$), a p-type or i-type $In_{x1}Ga_{1-x1}As_{1-y1}P_{y1}$ upper optical waveguide layer 26, a p-type $In_{0.5}Ga_{0.5}P$ first upper cladding layer 27, a GaAs etching stop layer 28, an n-type $In_{0.5}(Ga_{0.9}Al_{0.1})_{0.5}P$ current confinement layer 29, and a GaAs cap layer 30 are formed in this order on a (100) face of an n-type GaAs substrate 21 by organometallic vapor phase epitaxy.

Subsequently, a resist pattern which has a stripe opening having a width of 3 micrometers and extending in the normal (forward) mesa direction of the substrate 21 is formed by photolithography, and the GaAs cap layer 30 is etched by using the resist pattern as a mask and a mixture containing tartaric acid as an etchant. Then, the resist pattern is removed, and the n-type $In_{0.5}(Ga_{0.9}Al_{0.1})_{0.5}P$ current confinement layer 29 is etched by using the remaining portions of the GaAs cap layer 30 as a mask and a solution of hydrochloric acid as an etchant. Thereafter, the remaining portions of the GaAs cap layer 30 and the exposed portion of the GaAs etching stop layer 28 are concurrently etched off by using a mixture containing tartaric acid as an etchant.

Next, the p-type $Al_{0.48}Ga_{0.52}As$ second upper cladding layer 31 and the p-type GaAs contact layer 32 are formed by organometallic vapor phase epitaxy. Subsequently, a resist pattern film is formed by photolithography on only predetermined portions of the p-type GaAs contact layer 32 in vicinities of opposite end facets perpendicular to the direction of laser emission and vicinities of lateral side edges parallel to the direction of laser emission. Then, the surface of the p-type GaAs contact layer 32 which is not covered by the resist pattern film is cleaned with a solution of hydrochloric acid, a Ti/Pt/Au electrode is formed as a p electrode 35 by EB evaporation on the entire upper surface of the layered structure, and the portions of the p electrode 35 formed above the resist pattern film (in the vicinities of the opposite end facets perpendicular to the direction of laser emission and the vicinities of the lateral side edges of the semiconductor laser device) are selectively removed by the lift-off technique, so that a stripe portion of the p electrode 35 corresponding to a current injection region remains and the portions of the p-type GaAs contact layer 32 located in the vicinities of the opposite end facets perpendicular to the direction of laser emission and the vicinities of the lateral side edges of the semiconductor laser device are exposed.

Next, the exposed portions of the p-type GaAs contact layer 32 are selectively etched off by using the stripe portion of the p electrode 35 as a mask and a mixture containing ammonia and hydrogen peroxide as an etchant, so that the portions of the p-type $Al_{0.48}Ga_{0.52}As$ second upper cladding layer 31 under the etched off portions of the p-type GaAs contact layer 32 are exposed. Then, the surfaces of the exposed portions of the p-type $Al_{0.48}Ga_{0.52}As$ second upper cladding layer 31 are cleaned with water into which ozone or oxygen is purposely mixed by bubbling. At this time, the hydrogen peroxide contained in the etchant and the ozone or oxygen purposely mixed into the cleaning water cause oxidation and automatically form an oxide film on the upper surfaces of the portions of the p-type $Al_{0.48}Ga_{0.52}As$ second upper cladding layer 31.

After the structure preventing current injection in the vicinities of the opposite end facets perpendicular to the direction of laser emission and the vicinities of the lateral side edges parallel to the direction of laser emission is formed as above, RTA alloy processing is performed at 450° C. for one minute. Then, the n-type GaAs substrate 21 is polished to the thickness of 100 micrometers, an AuGe/Ni/Au electrode is formed as an n electrode 36 on the entire polished surface of the n-type GaAs substrate 21 by EB evaporation, and RTA alloy processing is performed at 350° C. for one minute.

Subsequently, overcoating layers made of the electrode materials of Ti/Pt/Au are formed by EB evaporation over the p electrode 35 and the n electrode 36.

Finally, a wafer on which the layered structure is formed as above for each semiconductor laser device is cleaved at the positions of the end facets, and a high reflectance coating and a low reflectance coating are applied to the resonator surfaces produced by the cleavage.

Advantages and Variation of Concrete Examples I and II

As explained above, in the semiconductor laser devices as the concrete examples I and II, near-edge portions of the p-type GaAs cap layer are etched off with an etching solution containing oxygen as a constituent element. Therefore, aluminum in the near-edge portions of the p-type $Al_{0.48}Ga_{0.52}As$ second upper cladding layer exposed by the etching, which has high aluminum composition and is located under the near-edge portions of the p-type GaAs cap layer, is oxidized by the etching, and an oxide film having an insulation property is automatically formed on the surfaces of the near-edge portions of the p-type $Al_{0.48}Ga_{0.52}As$ second upper cladding layer. Thus, the current noninjection regions can be realized.

In addition, since the semiconductor laser devices as the concrete examples I and II have a structure in which the near-edge portions of the p-type $Al_{0.48}Ga_{0.52}As$ second upper cladding layer being located in the vicinities of the end facets and having high aluminum composition are exposed, it is easy to selectively insulate the near-edge portions of the p-type $Al_{0.48}Ga_{0.52}As$ second upper cladding layer in the vicinities of the end facets by processing the surfaces of the near-edge portions of the p-type $Al_{0.48}Ga_{0.52}As$ second upper cladding layer with water into which ozone gas is mixed by bubbling, or introducing oxygen gas during the electrode sintering heat treatment.

Further, since a structure in which current is not injected in the vicinities of end facets can be formed, and the junction-down mounting, which enables high heat dissipation, can be used, it is possible to realize a high-output-power semiconductor laser device.

In the first and second embodiments and the concrete examples I and II, only the near-edge portions of the p-type AlGaAs second upper cladding layer in the vicinities of the end facets are selectively insulated, and the p electrode is formed on the p-type GaAs contact layer, and may also be formed on the insulated portions of the p-type AlGaAs second upper cladding layer. Alternatively, the p electrode can be formed directly on the near-edge portions of the p-type AlGaAs second upper cladding layer without insulation. In this case, a Schottky barrier is generated between the p electrode and the near-edge portions of the p-type AlGaAs second upper cladding layer. Therefore, a similar advantage to those of the first and second embodiments and the concrete examples I and II can be obtained.

What is claimed is:

1. A semiconductor laser device comprising:
   an active layer;
   a cladding layer made of p-type $Al_{x2}Ga_{1-x2}As$ and formed above said active layer, where $x2 \geq 0.3$;
   a contact layer made of p-type GaAs and formed on said cladding layer except for at least one near-edge portion of the cladding layer; and
   an electrode formed on at least said contact layer;
   wherein an upper surface of the cladding layer in said at least one near-edge portion thereof is insulated, and said at least one near-edge portion of the cladding layer is located in a vicinity of one of opposite end facets perpendicular to a direction of laser emission.

2. A semiconductor laser device according to claim 1, wherein said upper surface is insulated by oxidation.

3. A semiconductor laser device according to claim 1, wherein said electrode is formed on said upper surface as well as said contact layer.

4. A semiconductor laser device according to claim 1, further comprising a stripe structure including a current injection region and having a predetermined width, wherein said at least one near-edge portion of the cladding layer extends over at least the predetermined width of said stripe structure in the vicinity of the one of the opposite end facets.

5. A process for producing a semiconductor laser device, comprising the steps of:
   (a) forming a semiconductor layers including an active layer;
   (b) forming over said semiconductor layers a cladding layer made of p-type $Al_zGa_{1-z}As$, where $z \geq 0.3$;
   (c) forming on said cladding layer a contact layer made of p-type GaAs;
   (d) removing at least one near-edge portion of said contact layer so as to expose at least one near-edge portion of said cladding layer, insulating said at least one near-edge portion of said cladding layer, and forming an electrode at least on said contact layer, where at least one near-edge portion of said contact layer and said at least one near-edge portion of the cladding layer is located in a vicinity of one of opposite end facets perpendicular to a direction of laser emission.

6. A process according to claim 5, wherein said at least one near-edge portion of said cladding layer is insulated by oxidation.

7. A process according to claim 5, wherein said electrode is formed on said at least one near-edge portion of said cladding layer as well as said contact layer.

8. A process according to claim 5, wherein said semiconductor laser devise comprises a stripe structure including a current injection region and having a predetermined width, wherein said at least one near-edge portion of the cladding layer extends over at least the predetermined width of said stripe structure in the vicinity of the one of the opposite end facets.

9. A semiconductor laser device comprising:
   a substrate made of n-type GaAs;
   a buffer layer made of n-type GaAs and formed above said substrate;
   a lower cladding layer made of n-type $In_{0.5}Ga_{0.5}P$ and formed above said buffer layer;
   a lower optical waveguide layer made of n-type or i-type $In_{Ga1-x1}As_{1y1}P_{y1}$ and formed above said lower cladding layer, where $0 \leq x1 \leq 0.3$, $x1=0.5y1$;
   a quantum-well active layer made of $In_{x3}Ga_{1-x3}As_{1-y3}P_{y3}$ and formed above said lower optical waveguide layer, where $0 \leq x3 \leq 0.4$, $0 \leq y3 \leq 0.1$;
   an upper optical waveguide layer made of p-type or i-type $In_{x1}Ga_{1-x1}As_{1-y1}P_{y1}$ and formed above said quantum-well active layer;
   a first upper cladding layer made of p-type $In_{0.5}Ga_{0.5}P$ and formed above said upper optical waveguide layer;
   an etching stop layer made of GaAs and formed above said first upper cladding layer except for a stripe portion of the first upper cladding layer so as to form a first portion of a stripe groove which comprises a current injection region;
   a current confinement layer made of n-type $In_{0.5}(Ga_{1-x4}Al_{x4})_{0.5}P$ and formed above said etching stop layer so as to form a second portion of said stripe groove, where $0 \leq x4 \leq 1$;
   a second upper cladding layer made of p-type $Al_zGa_{1-z}As$ and formed over said current confinement layer so as to fill said stripe groove, where $0.48 \leq z \leq 0.85$;
   a contact layer made of p-type GaAs and formed on said second upper cladding layer except for at least one near-edge portion of the second upper cladding layer; and
   an electrode formed at least on said contact layer;
   wherein an upper surface of the second upper cladding layer in said at least one near-edge portion thereof is insulated, and said at least one near-edge portion of the second upper cladding layer is located in a vicinity of one of opposite end facets perpendicular to a direction of laser emission.

10. A semiconductor laser device according to claim 9, wherein said upper surface is insulated by oxidation.

11. A semiconductor laser device according to claim 9, wherein said electrode is formed on said upper surface as well as said contact layer.

12. A semiconductor laser device according to claim 9, wherein said stripe groove has a predetermined width, and of said at least one near-edge portion of the second upper cladding layer extends over at least the predetermined width of said stripe groove in the vicinity of the one of the opposite end facets.

13. A process for producing a semiconductor laser device, comprising the steps of:
   (a) forming a buffer layer made of n-type GaAs, a lower cladding layer made of n-type $In_{0.5}Ga_{0.5}P$, a lower optical waveguide layer made of n-type or i-type $In_{x1}Ga_{1-x1}As_{1-y1}P_{y1}$, a quantum-well active layer made of $In_{x3}Ga_{1-x3}As_{1-y3}P_{y3}$, an upper optical waveguide layer made of p-type or i-type $In_{x1}Ga_{1-x1}As_{1-y1}P_{y1}$, a first upper cladding layer made of p-type $In_{0.5}Ga_{0.5}P$, an etching stop layer made of GaAs, a current confinement layer made of n-type $In_{0.5}(Ga_{1-x4}Al_{x4})_{0.5}P$, and a cap layer made of GaAs in this order above a substrate made of n-type GaAs, where $0 \leq x1 \leq 0.3$, $x1=0.5y1$, $0 \leq x3 \leq 0.4$, $0 \leq y3 \leq 0.1$, and $0 \leq x4 \leq 1$;
   (b) removing a first portion of said cap layer having a stripe form and corresponding to a current injection region so as to leave a second portion of said cap layer;
   (c) etching off a first portion of said current confinement layer having a stripe form by using said second portion of said cap layer as a mask so as to leave a second portion of said current confinement layer and form a first portion of a stripe groove for current injection;

(d) removing said second portion of said cap layer and a first portion of said etching stop layer having a stripe form so as to leave a second portion of said etching stop layer and form a second portion of said stripe groove;

(e) forming over said second portion of said current confinement layer a second upper cladding layer made of p-type $Al_zGa_{1-z}As$ so as to fill said stripe groove, where $0.48 \leq z \leq 0.85$;

(f) forming on said second upper cladding layer a contact layer made of p-type GaAs;

(g) removing at least one near-edge portion of said contact layer so as to expose at least one near-edge portion of said second upper cladding layer, insulating said at least one near-edge portion of said second upper cladding layer, and forming an electrode at least on said contact layer, where said at least one near-edge portion of said contact layer and said at least one near-edge portion of the second upper cladding layer is located in a vicinity of one of opposite end facets perpendicular to a direction of laser emission.

14. A process according to claim 13, wherein said at least one near-edge portion of said cladding layer is insulated by oxidation.

15. A process according to claim 13, wherein said electrode is formed on said at least one near-edge portion of said cladding layer as well as said contact layer.

16. A process according to claim 13, wherein said stripe groove has a predetermined width, and said at least one near-edge portion of the second upper cladding layer extends over at least the predetermined width of said stripe groove in the vicinity of the one of the opposite end facets.

17. The semiconductor laser device of claim 1, wherein a surface of the cladding layer away from the active layer is substantially flat.

18. The process for producing a semiconductor laser device of claim 5, wherein a surface of the cladding layer away from the active layer is formed to be substantially flat.

19. The semiconductor laser device of claim 1, wherein the cladding fills in a stripe grove formed in at least a current confinement layer, said confinement layer underlying the cladding layer.

* * * * *

UNITED STATES PATENT AND TRADEMARK OFFICE
CERTIFICATE OF CORRECTION

PATENT NO. : 6,901,100 B2  Page 1 of 1
APPLICATION NO. : 10/187798
DATED : May 31, 2005
INVENTOR(S) : Mukaiyama et al.

It is certified that error appears in the above-identified patent and that said Letters Patent is hereby corrected as shown below:

On the title page,

[*] Notice: Subject to any disclaimer, the term of this patent is extended or adjusted under 35 USC 154(b) by 53 days.

Delete the phrase "by 53 days" and insert -- by 155 days --

Signed and Sealed this

Nineteenth Day of August, 2008

JON W. DUDAS
*Director of the United States Patent and Trademark Office*